(12) United States Patent
Jones et al.

(10) Patent No.: US 10,053,746 B1
(45) Date of Patent: Aug. 21, 2018

(54) PROCESS FOR REPAIRING A WORN CARBURIZED STEEL SURFACE OF A SPRAG CLUTCH

(71) Applicants: Russell B Jones, North Palm Beach, FL (US); Robert J. Wright, Jupiter, FL (US)

(72) Inventors: Russell B Jones, North Palm Beach, FL (US); Robert J. Wright, Jupiter, FL (US)

(73) Assignee: FLORIDA TURBINE TECHNOLOGIES, INC., Jupiter, FL (US)

( * ) Notice: Subject to any disclaimer, the term of this patent is extended or adjusted under 35 U.S.C. 154(b) by 0 days.

(21) Appl. No.: 15/339,472

(22) Filed: Oct. 31, 2016

Related U.S. Application Data

(60) Provisional application No. 62/290,080, filed on Feb. 2, 2016.

(51) Int. Cl.
| | | |
|---|---|---|
| *C23C 14/32* | (2006.01) | |
| *C21D 9/00* | (2006.01) | |
| *B23P 6/00* | (2006.01) | |
| *C23F 17/00* | (2006.01) | |
| *C23F 4/00* | (2006.01) | |
| *C23C 14/02* | (2006.01) | |
| *C23C 14/22* | (2006.01) | |
| *C23C 18/50* | (2006.01) | |
| *C23C 18/18* | (2006.01) | |
| *B24B 1/00* | (2006.01) | |
| *F16D 41/06* | (2006.01) | |

(52) U.S. Cl.
CPC .............. *C21D 9/0068* (2013.01); *B23P 6/00* (2013.01); *B24B 1/00* (2013.01); *C23C 14/022* (2013.01); *C23C 14/028* (2013.01); *C23C 14/22* (2013.01); *C23C 18/1806* (2013.01); *C23C 18/1827* (2013.01); *C23C 18/50* (2013.01); *C23F 4/00* (2013.01); *C23F 17/00* (2013.01); *F16D 2041/0603* (2013.01); *F16D 2250/0038* (2013.01); *F16D 2250/0046* (2013.01)

(58) Field of Classification Search
CPC ... C23C 14/325; C23C 14/022; C23C 14/028; C23C 14/22; C23C 18/50; C23C 18/1827; C23C 18/1806; C21D 9/0068; C23F 17/00; C23F 4/00; B24B 1/00; F16D 2041/0603; F16D 2250/0038; F16D 2250/0046
USPC ...................................... 204/192.38
See application file for complete search history.

(56) References Cited

U.S. PATENT DOCUMENTS

| | | | | |
|---|---|---|---|---|
| 2008/0160213 | A1* | 7/2008 | Maly ....................... | B23P 6/007 427/569 |
| 2012/0160664 | A1* | 6/2012 | Ivory ........................ | B23P 6/00 204/192.38 |

* cited by examiner

*Primary Examiner* — Rodney G McDonald
(74) *Attorney, Agent, or Firm* — John Ryznic

(57) ABSTRACT

A method of repairing a worn carburized surface on a sprag clutch comprising the steps of: grinding the worn carburized surface of the sprag clutch to prepare the surface for metallurgical bonding; place the worn carburized surface in a PVD Cathodic Arc chamber; preheat the worn carburized surface to remove moisture and provide for a good metallurgical bonding surface; reverse sputter clean the surface to remove any surface oxide; apply a first coating layer using the PVD process to a maximum thickness; change the coating macro topology by polishing the coated surface; apply a second coating layer using the PVD process to a maximum thickness; and, grind or polish the coating to a desired dimension.

5 Claims, 10 Drawing Sheets

PROCESS FOR REPAIRING A WORN CARBURIZED STEEL SURFACE OF A SPRAG CLUTCH

CROSS-REFERENCE TO RELATED APPLICATIONS

This application claims the benefit to U.S. Provisional Application 62/290,080 filed on Feb. 2, 2016 and entitled PROCESS FOR REPAIRING A WORN CARBURIZED STEEL SURFACE OF A SPRAG CLUTCH.

Process for repairing a worn carburized steel surface of a sprag clutch.

GOVERNMENT LICENSE RIGHTS

None.

BACKGROUND OF THE INVENTION

Field of the Invention

The present invention relates generally to a process for repairing a worn carburized steel surface, and more specifically to a process for repairing a worn carburized steel surface of a sprag clutch of a helicopter rotor transmission.

Description of the Related Art Including Information Disclosed Under 37 CFR 1.97 and 1.98

Components of steel that are desired to have high surface hardness for wear resistance are often made from steels that are subsequently carburized after detailed machining to create locally hardened surfaces. Examples of these components are sprag clutches, gears, shafts, and bearing journals.

A particular case of a shaft is one which a sprag clutch rides on a hardened surface for the capability of having freedom of motion in one rotation direction, and "locking-up" or torque transmission in the opposite relative rotation direction. The geometry is generally an outer component with an internal bore that is sufficiently hardened positioned about a sprag clutch assembly that is positioned about a shaft or component with a hardened outer diameter. The relationship between the outer component ID, the sprag element (Pawl) operating radial height, and the inner component shaft outer diameter is critical to distribute the contact force engaging the pawls between the inner and outer component.

Over time in operation, wear occurs on the inner and outer components that are deemed incompatible to reintroduce into proper operation. These components being carburized or "case-hardened" are not capable of being weld repaired without the risk of surface cracking. Machining off the outer hardened surface is often impractical as the depth of the hardened surface is not uniformly controlled and that the integrity of the parts could be compromised in this machining process prepping for a weld build up repair.

U.S. Pat. No. 6,307,178 issued to Gierull on Oct. 23, 2001 and entitled METHOD FOR WELDING SHAPED BODIES MADE OF CARBURIZED HEAT-TREATED STEEP discloses a method for repairing such carburized parts by weld repair by heating such parts to 700 to 900 C. For finished components such as gears and shafts, this heating would likely dimensionally distort the components and render them useless. Such distortion in a sprag clutch would make the clutch inoperable and thus unusable.

For components needing dimensional restoration of hardened surface in the magnitude up to 0.0002" in thickness, hard coatings have been utilized. TiN and other hard coatings have limits to their application thickness due to limitations in the coating process that induce cracking and poor surface finish.

The described invention embodiments solve the limitations of thickness application, prevent subsurface cracking, and have means for improving surface finish while resulting in a metallurgical bond to the input substrate without dimensional distortion.

BRIEF SUMMARY OF THE INVENTION

A process for repairing a worn carburized surface such as that in a worn sprag clutch, where the worn carburized surface is removed by grinding, the surface is cleaned, the ground surface is pre-heated to remove moisture, the pre-heated surface is cleaned using a reverse sputter process, and then the worn surface is built up using a PVD Cathodic Arc chamber where a first coating is applied with a maximum thickness, the new coating is cleaned using a reverse sputter process, the first coating is polished and then cleaned using the reverse sputter process, and then a second coating with a desired thickness is applied using the PVD process. The new coating is then grinded and then polished to a surface finish of 30 micro inches smoothness.

In another process for repairing a worn carburized surface on a sprag clutch, the worn carburized surface is removed by grinding, the surface is then chemically cleaned for electroplating, the surface is chemically activated to remove any oxide, and a new coating is applied using an electroless nickel-boron-thallium plating solution by chemical plating. When the new coating has reached its desired thickness, the new coating is heat treated to produce a hardness of the new coating of 69Rc, and then the new coating is machined to a specific thickness and then polished to a surface finish of 30 micro inches in smoothness.

DETAILED DESCRIPTION OF THE INVENTION

The present invention is a process for repairing a worn hardened steel surface without distorting the part that creates a metallurgical bond between the coating and the substrate to be build-up on the worn surface of the part and then resurfaced to dimensional specifications such as in a sprag clutch. Several embodiments of the present invention in which a worn carburized surface can be restored without having to use high temperature so that it would not distort the surface. The process of restoring a hardened or carburized surface on a part (of the present invention) does not heat up the part above 500 degrees F. which is far below the 1,200 degrees F. that would be required for welding a new coating to a worn carburized surface that will induce distortions on the new surface. Worn carburized surfaces that can make use of the present invention include a sprag clutch, a shaft, a gear, and a bearing journal among other parts that are case or surface hardened.

A sprag clutch on a Pratt & Whitney PT6T engine is used in a helicopter rotor transmission and is removed after 1,500 hours of service time. If the sprag clutch area of the shaft is worn beyond specifications, the shaft is discarded. Each new shaft costs approximately $20,000 to replace. The cost of the coating and resurfacing process of the present invention would be a small fraction of the original cost of the new shaft.

Figure 1:
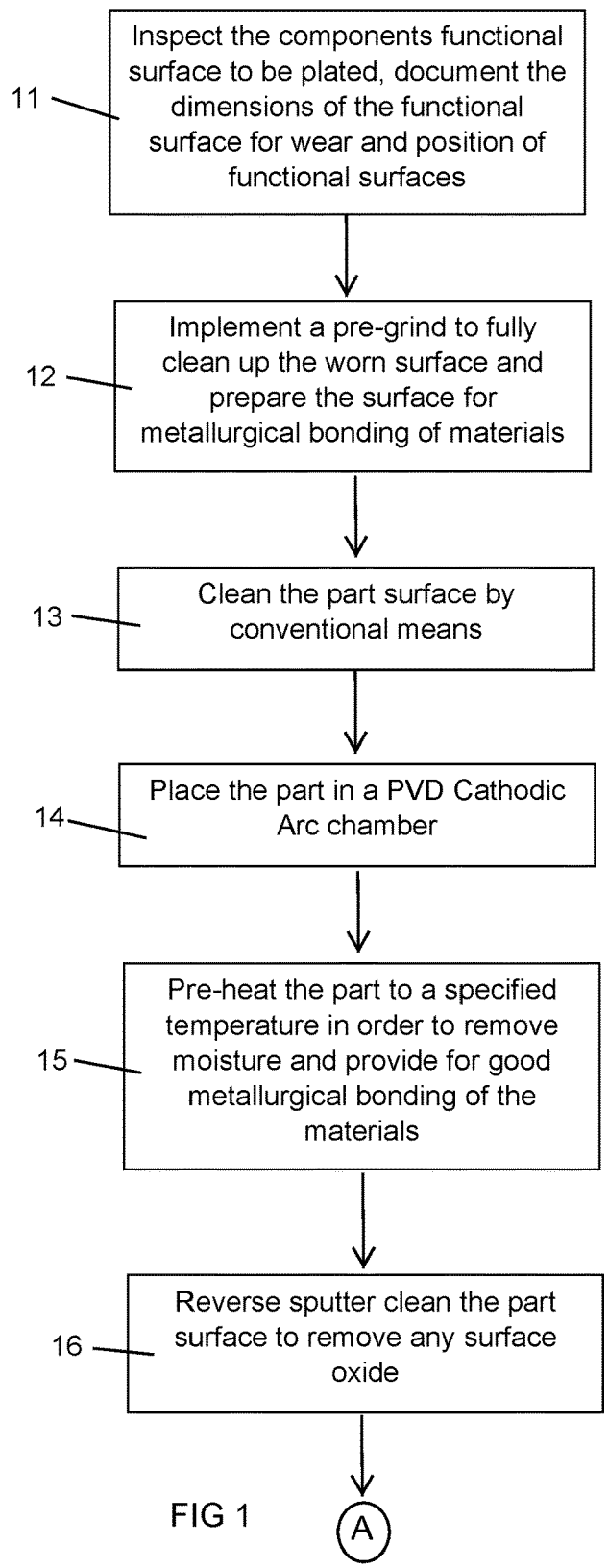
FIGS. 1 and 2 shows a flow chart of the first embodiment of the process for replacing a worn carburized coating on a part of the present invention.
Figure 2:
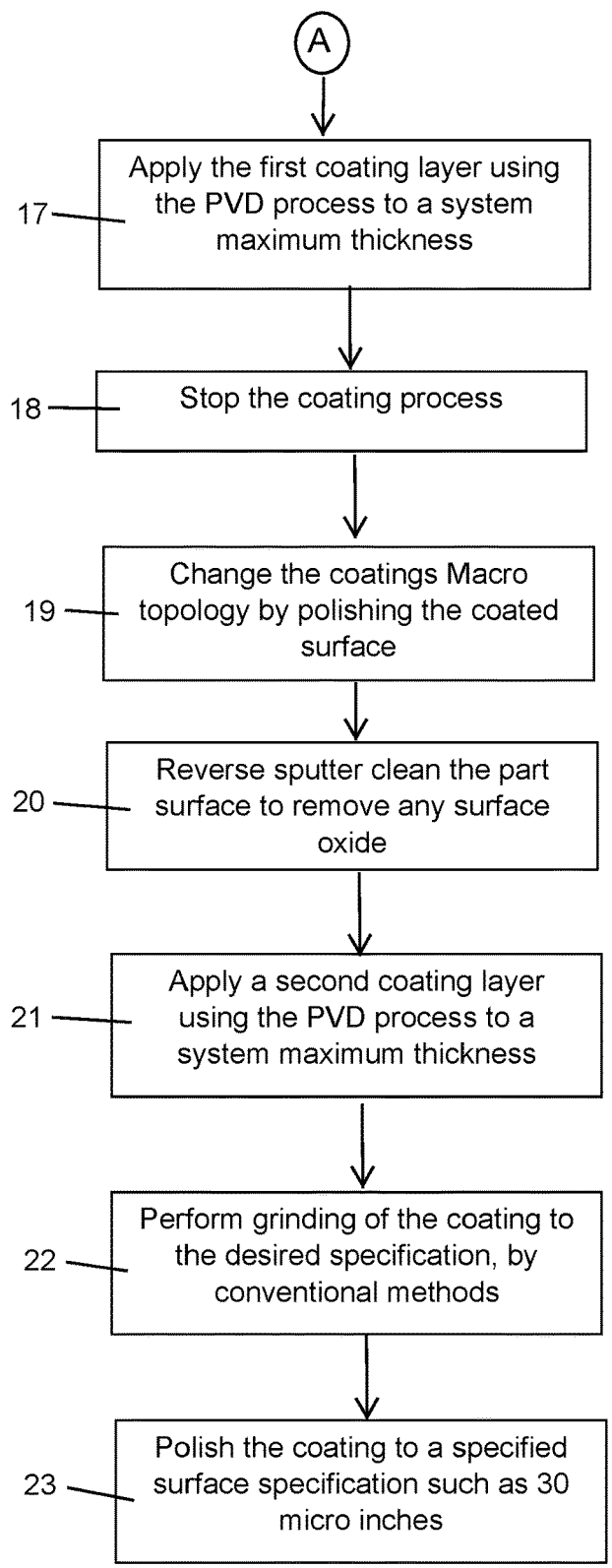

The first embodiment is a coating topology issues resolution for achieving maximum coating thickness using a PVD (Positive Vapor Deposition) Cathodic Arc CrN (chrome nitride). In a first embodiment (FIGS. 1 and 2), the steps include: Inspect the components functional surface to be plated, document the dimensions of the functional surface for wear and position of functional surfaces (step 11); Implement a pre-grind to fully clean up the worn surface and prepare the surface for metallurgical bonding of materials (step 12); Clean the part surface by conventional means (step 13); Place the part in a PVD Cathodic Arc chamber (step 14); Pre-heat the part to a specified temperature in order to remove moisture (from the part surface of the part) and provide for good metallurgical bonding of the materials (step 15); Reverse sputter clean the part surface to remove any surface oxide (step 16); Apply the first coating layer using the PVD process to a system maximum thickness (step 17); Stop the coating process (step 18); Change the coatings Macro topology by polishing the coated surface (step 19); Reverse sputter clean the part surface to remove any surface oxide (step 20); Apply a second coating layer using the PVD process to a system maximum thickness (step 21); Perform grinding of the coating to the desired specification, by conventional methods (step 22); and then Polish the coating to a specified surface specification such as 30 micro inches (step 23).

Figure 3:
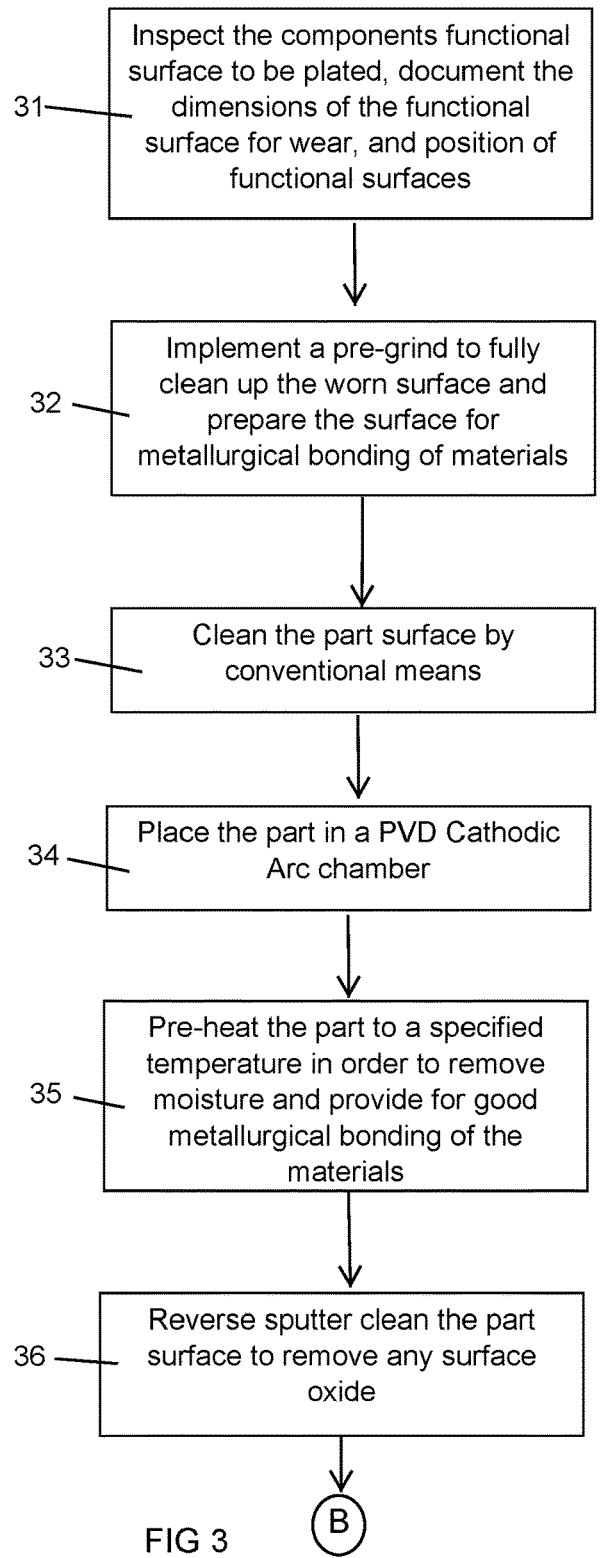
FIGS. 3 and 4 shows a flow chart of the second embodiment of the process for replacing a worn carburized coating on a part of the present invention.
Figure 4:
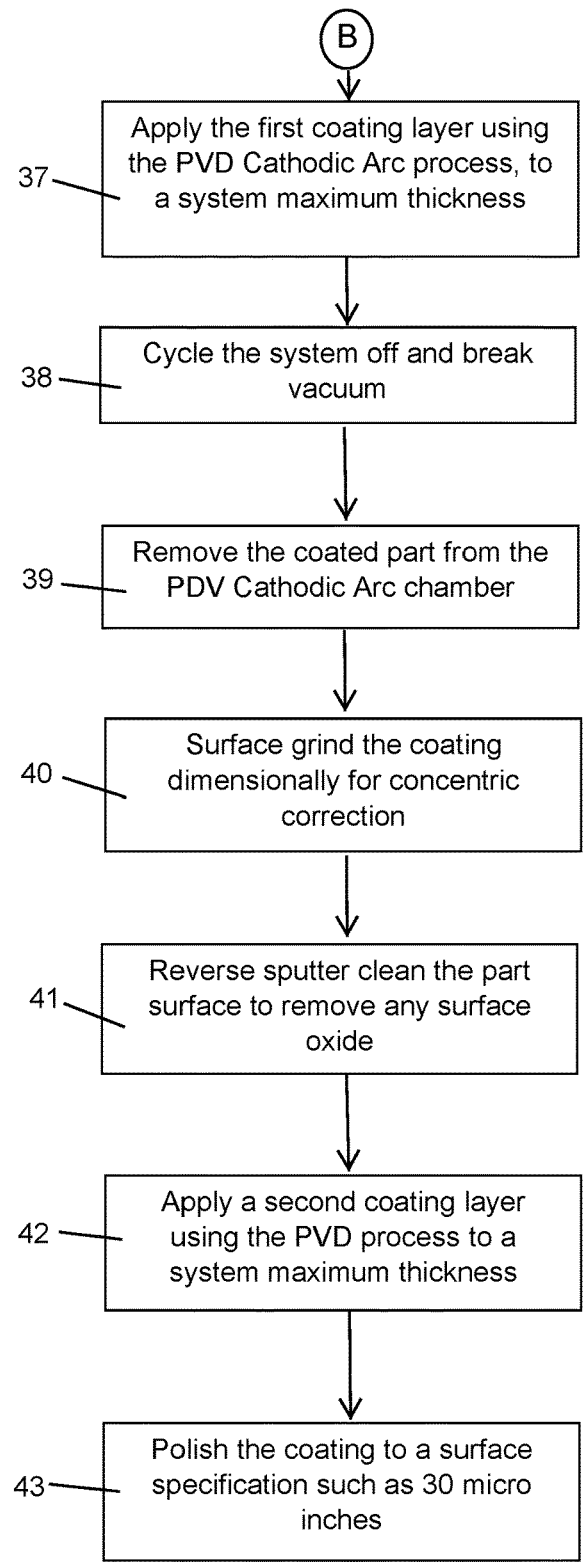

A second embodiment of the present invention is a coating dimensional growth PVD Cathodic Arc CrN process (FIGS. 3 and 4). The steps include: Inspect the component's functional surface to be plated, document the dimensions of the functional surface for wear, and position of functional surfaces (step 31); Implement a pre-grind to fully clean up the worn surface and prepare the surface for metallurgical bonding of materials (step 32); Clean the part surface by conventional means (step 33); Place the part in a PVD Cathodic Arc chamber (step 34); Pre-heat the part to a specified temperature in order to remove moisture (from the part surface of the part) and provide for good metallurgical bonding of the materials (step 35); Reverse sputter clean the part surface to remove any surface oxide (step 36); Apply the first coating layer using the PVD Cathodic Arc process, to a system maximum thickness (step 37); Cycle the system off and break vacuum (step 38); Remove the coated part from the PDV Cathodic Arc chamber (step 39); Surface grind the coating dimensionally for concentric correction (step 40); Reverse sputter clean the part surface to remove any surface oxide (step 41); Apply a second coating layer using the PVD process to a system maximum thickness (step 42); and then Polish the coating to a surface specification such as 30 micro inches (step 43).

Figure 5:
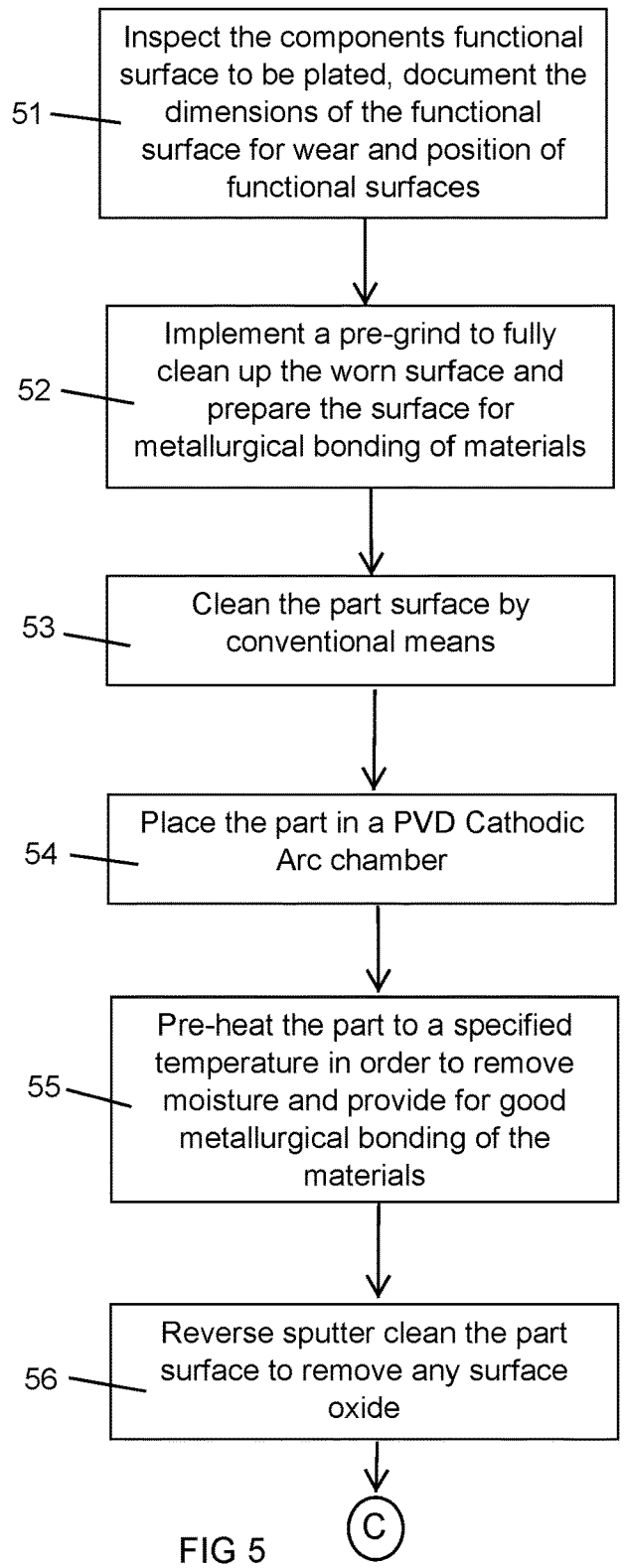
FIGS. 5 and 6 shows a flow chart of the third embodiment of the process for replacing a worn carburized coating on a part of the present invention.
Figure 6:
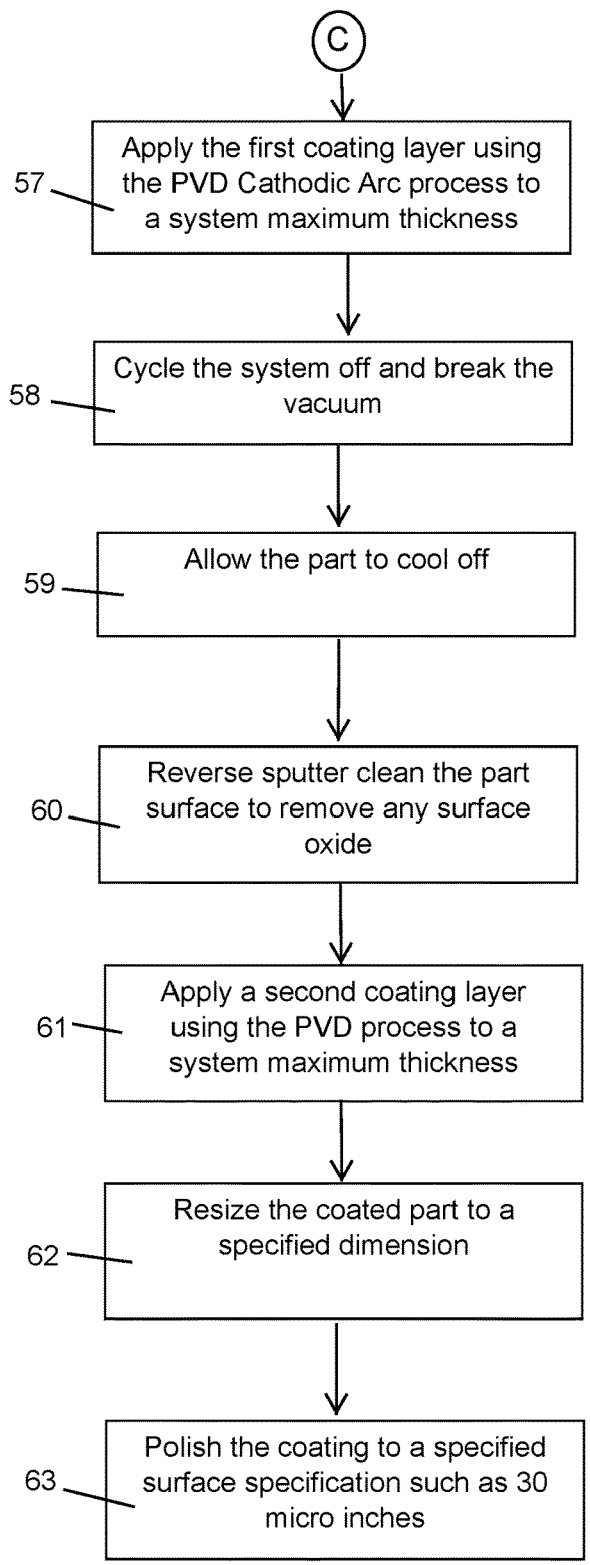

A third embodiment of the present invention is coating thermal stress relief PVD Cathodic Arc CrN coating (FIGS. 5 and 6). The steps include: Inspect the components functional surface to be plated, document the dimensions of the functional surface for wear and position of functional surfaces (step 51); Implement a pre-grind to fully clean up the worn surface and prepare the surface for metallurgical bonding of materials (step 52); Clean the part surface by conventional means (step 53); Place the part in a PVD Cathodic Arc chamber (step 54); Pre-heat the part to a specified temperature in order to remove moisture (from the part surface of the part) and provide for good metallurgical bonding of the materials (step 55); Reverse sputter clean the part surface to remove any surface oxide (step 56); Apply the first coating layer using the PVD Cathodic Arc process to a system maximum thickness (step 57); Cycle the system off and break the vacuum (step 58); Allow the part to cool off (step 59); Reverse sputter clean the part surface to remove any surface oxide (step 60); Apply a second coating layer using the PVD process to a system maximum thickness (step 61); Resize the coated part to a specified dimension (step 62); and then Polish the coating to a specified surface specification such as 30 micro inches (step 63).

Figure 7:
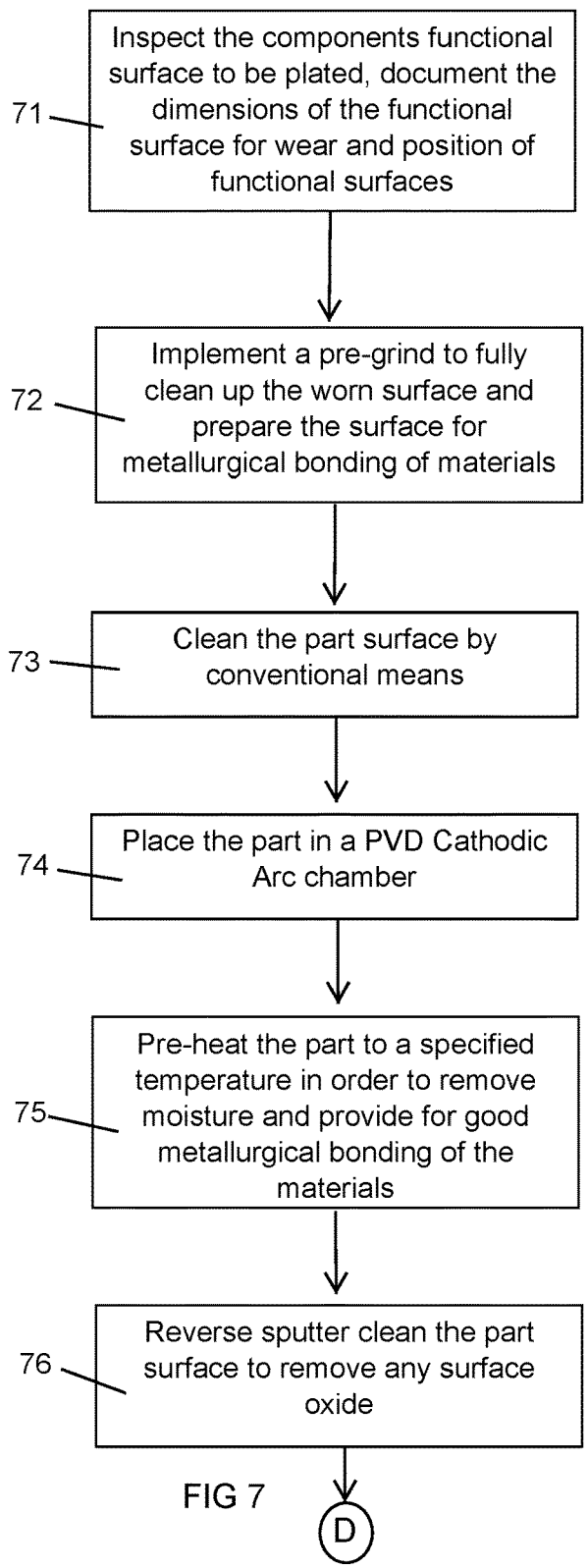
FIGS. 7 and 8 shows a flow chart of the fourth embodiment of the process for replacing a worn carburized coating on a part of the present invention.
Figure 8:
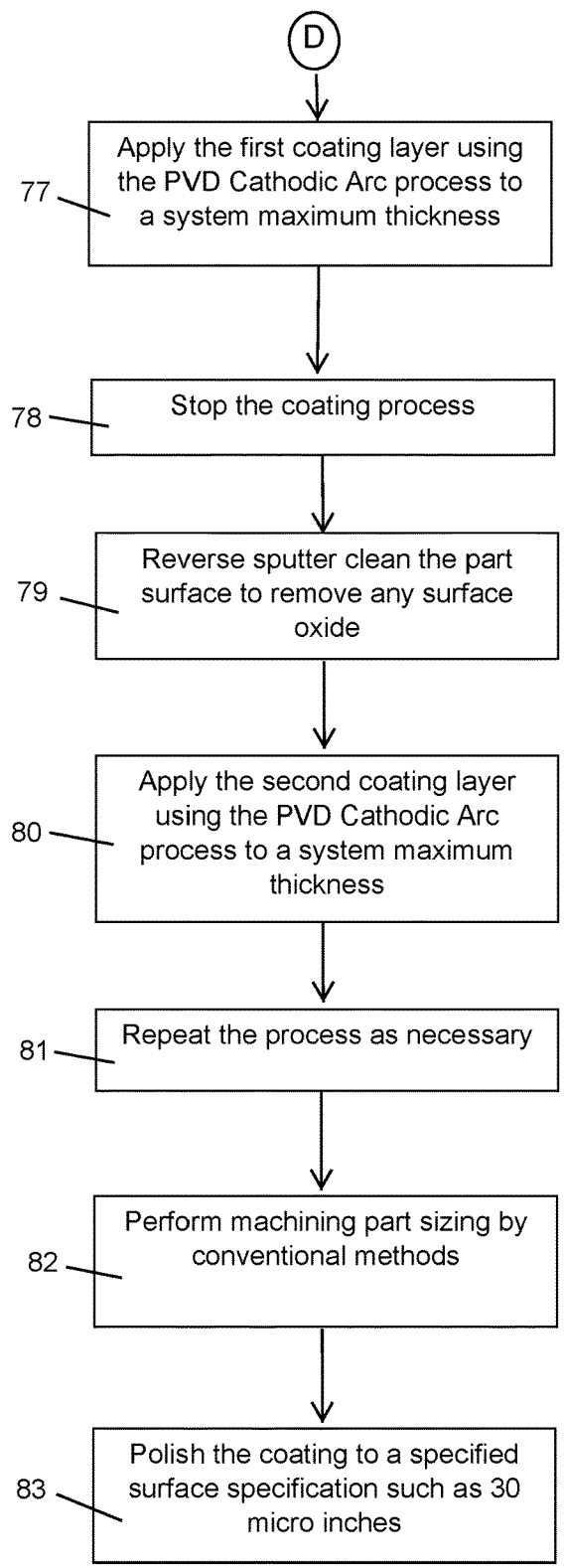

A fourth embodiment of the present invention is a PVD Cathodic Arc CrN for maximum coating thickness (FIGS. 7 and 8). The steps include: Inspect the components functional surface to be plated, document the dimensions of the functional surface for wear and position of functional surfaces (step 71); Implement a pre-grind to fully clean up the worn surface and prepare the surface for metallurgical bonding of materials (step 72); Clean the part surface by conventional means (step 73); Place the part in a PVD Cathodic Arc chamber (step 74); Pre-heat the part to a specified temperature in order to remove moisture (from the part surface of the part) and provide for good metallurgical bonding of the materials (step 75); Reverse sputter clean the part surface to remove any surface oxide (step 76); Apply the first coating layer using the PVD Cathodic Arc process to a system maximum thickness (step 77); Stop the coating process (step 78); Reverse sputter clean the part surface to remove any surface oxide (step 79); Apply the second coating layer using the PVD Cathodic Arc process to a system maximum thickness (step 80); Repeat the process as necessary (step 81); Perform machining part sizing by conventional methods (step 82); and then Polish the coating to a specified surface specification such as 30 micro inches (step 83).

Figure 9:
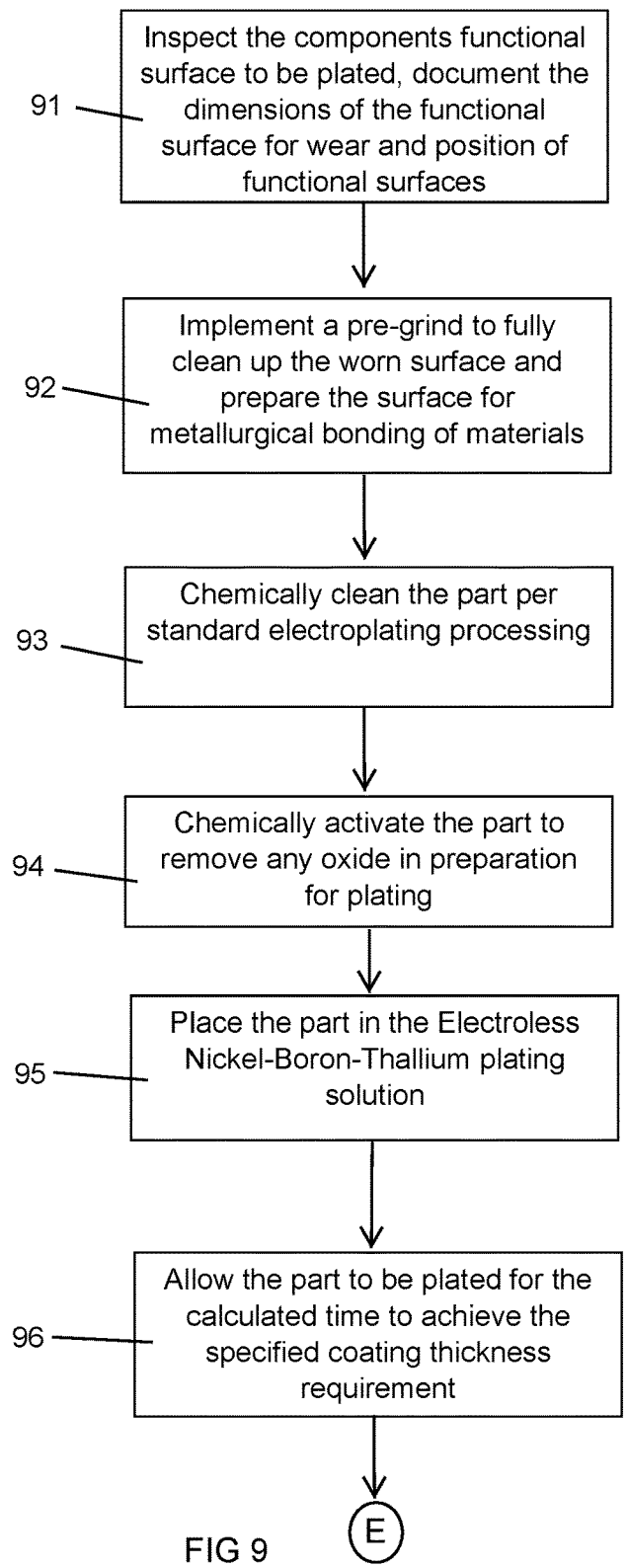
FIGS. 9 and 10 shows a flow chart of the fifth embodiment of the process for replacing a worn carburized coating on a part of the present invention.
Figure 10:
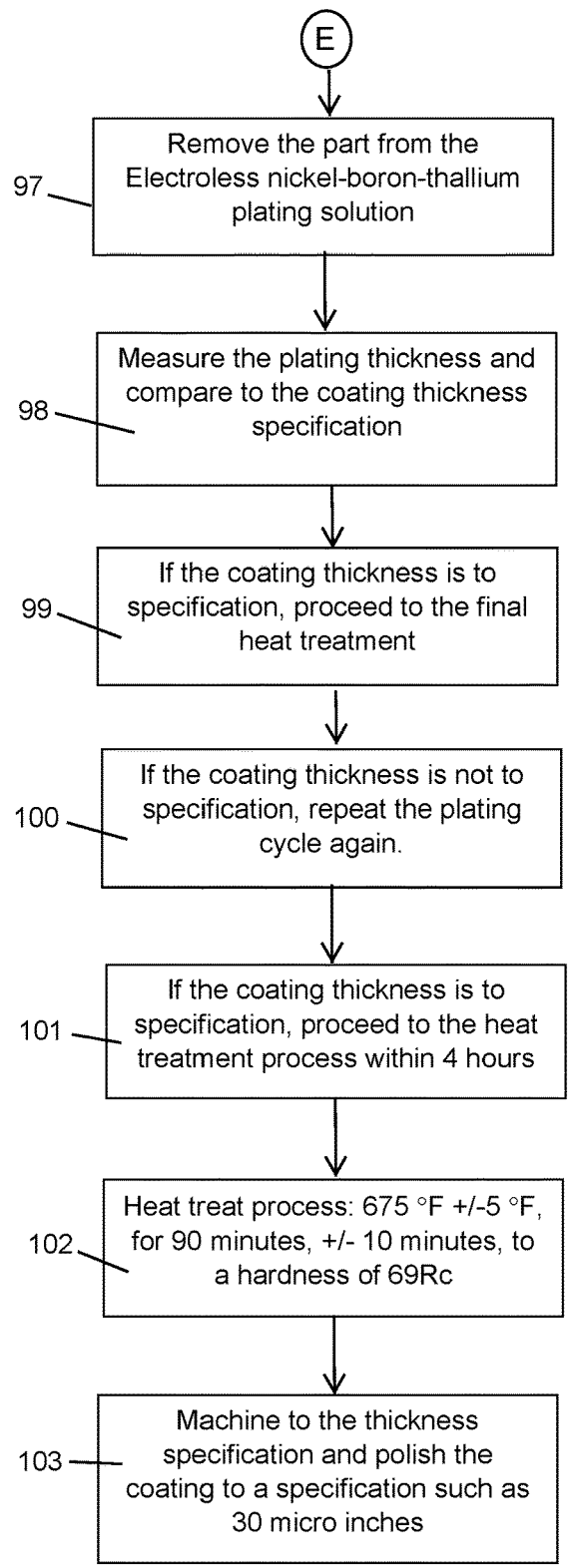

A fifth embodiment of the present invention is an electroless nickel-boron-thallium plating process (FIGS. 9 and 10). The steps include: Inspect the components functional surface to be plated, document the dimensions of the functional surface for wear and position of functional surfaces (step 91); Implement a pre-grind to fully clean up the worn surface and prepare the surface for metallurgical bonding of materials (step 92); Chemically clean the part per standard electroplating processing (step 93); Chemically activate the part to remove any oxide in preparation for plating (step 94); Place the part in the Electroless Nickel-Boron-Thallium plating solution (step 95); Allow the part to be plated for the calculated time to achieve the specified coating thickness requirement (step 96); Remove the part from the Electroless nickel-boron-thallium plating solution (step 97); Measure the plating thickness and compare to the coating thickness specification (step 98); If the coating thickness is to specification, proceed to the final heat treatment (step 99); If the coating thickness is not to specification, repeat the plating cycle again (step 100); If the coating thickness is to specification, proceed to the heat treatment process within 4 hours (step 101); Heat treat process: 675° F.+/−5° F., for 90 minutes, +/−10 minutes, to a hardness of 69Rc (step 102); and then Machine to the thickness specification and polish the coating to a specification such as 30 micro inches (step 103).

For the electroless nickel-boron-thallium plating process, all holes can be plugged or covered with a special masking type plug prior to the plating process. Each end of a shaft can be plugged to protect the shaft inner diameter. The masking material can be cured at room temperature for 12 to 16 hours. The final plating thickness on the diameter can be around 0.0022 inches thick. Post plating heat treatment can be used to provide for maximum hardness. To finish the part coating, polish the plated shaft diameter to a surface finish of around 30 micro inches.

In embodiments in FIGS. 1-8, the new coating is applied in two or more layers due to limitations of the PVD process. In the coating process, heat is generated. If the temperature rises above a certain temperature depending on the metal substrate, a risk of reducing the hardness of the metal substrate exists. Thus, applying the limited thickness coating without going above this transition temperature, cooling down the component being recoated, and recoating to the final thickness avoids disrupting the substrate hardness.

We claim the following:

1. A method of repairing a worn carburized surface on a sprag clutch comprising the steps of:
    grind the worn carburized surface of the sprag clutch to prepare the worn carburized surface for metallurgical bonding;
    place the worn carburized surface in a PVD Cathodic Arc chamber;
    preheat the worn carburized surface to remove moisture and provide for a metallurgical bonding surface;
    reverse sputter clean the surface to remove any surface oxide;
    apply a first coating layer of Chromium Nitride using a PVD process in the PVD Cathodic Arc chamber;
    change the first coating layer macro topology by polishing the first coated layer;
    apply a second coating layer of Chromium Nitride using the PVD process in the PVD Cathodic Arc chamber to a thickness in excess of an original specified dimension of the sprag clutch; and,
    grind or polish the second coating layer to a thickness resembling the original dimensions of the sprag clutch.

2. The method of repairing a worn carburized surface on a sprag clutch of claim 1, and further comprising the step of:
    prior to applying the second coating, reverse sputter clean the first coating layer surface to remove any surface oxide.

3. The method of repairing a worn carburized surface on a sprag clutch of claim 1, and further comprising the step of:
    the step of grinding or polishing the second coating layer includes grinding the second coating layer to the original dimensions of the sprag clutch and then polishing the coating.

4. The method of repairing a worn carburized surface on a sprag clutch of claim 3, and further comprising the step of:
    polish the coating to the original dimensions of the sprag clutch of 30 micro inches.

5. The method of repairing a worn carburized surface on a sprag clutch of claim 1, and further comprising the step of:
    the step of apply a first coating layer using a PVD process includes the step of keeping the worn carburized surface that is being repaired below a temperature such that distortion of the worn carburized surface does not occur.

* * * * *